(12) United States Patent
Bai et al.

(10) Patent No.: US 10,930,682 B2
(45) Date of Patent: Feb. 23, 2021

(54) ARRAY SUBSTRATE, METHOD FOR MANUFACTURING THE SAME AND DISPLAY APPARATUS

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Yajie Bai, Beijing (CN); Wu Wang, Beijing (CN); Xiaoyuan Wang, Beijing (CN); Zhuo Xu, Beijing (CN); Ruilin Bi, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 4 days.

(21) Appl. No.: 16/408,838

(22) Filed: May 10, 2019

(65) Prior Publication Data
US 2020/0105791 A1  Apr. 2, 2020

(30) Foreign Application Priority Data
Sep. 27, 2018 (CN) .......................... 201811130873.9

(51) Int. Cl.
*H01L 27/12* (2006.01)
*G02F 1/1362* (2006.01)

(52) U.S. Cl.
CPC ...... *H01L 27/124* (2013.01); *G02F 1/136259* (2013.01); *H01L 27/127* (2013.01); *H01L 27/1288* (2013.01); *G02F 2001/136263* (2013.01)

(58) Field of Classification Search
None
See application file for complete search history.

(56) References Cited

U.S. PATENT DOCUMENTS

| | | | | |
|---|---|---|---|---|
| 2006/0290858 | A1* | 12/2006 | Lai | G02F 1/136259 349/139 |
| 2009/0268119 | A1* | 10/2009 | Lee | H01L 27/1259 349/54 |
| 2016/0211275 | A1* | 7/2016 | Murakami | H01L 27/124 |
| 2017/0017131 | A1* | 1/2017 | Aoki | H01L 27/1244 |

* cited by examiner

*Primary Examiner* — Michelle Mandala
(74) *Attorney, Agent, or Firm* — Brooks Kushman P.C.

(57) ABSTRACT

An array substrate, a method for manufacturing the same, and a display apparatus are provided. The array substrate includes multiple pixel units defined by crossed gate lines and data lines, and each unit includes a pixel electrode and a thin film transistor. The array substrate further includes repairing units corresponding to target pixel electrodes in the pixel electrodes, where each repairing unit is connected to a corresponding target pixel electrode and a corresponding target signal line, and is configured to control the target pixel electrode connected to the repairing unit to be electrically connected to or insulated from the target signal line connected to the repairing unit.

19 Claims, 4 Drawing Sheets

ARRAY SUBSTRATE, METHOD FOR MANUFACTURING THE SAME AND DISPLAY APPARATUS

CROSS-REFERENCE TO RELATED APPLICATION

This application claims priority to Chinese Patent Application No. 201811130873.9 filed on Sep. 27, 2018, which is incorporated herein by reference in its entirety.

TECHNICAL FIELD

The present disclosure relates to the field of display technology, in particular to an array substrate, a method for manufacturing an array substrate, and a display apparatus.

BACKGROUND

In the technical field of liquid crystal display (LCD), thin film transistor liquid crystal displays (Thin Film Transistor Liquid Crystal Display, abbreviated as TFT-LCD hereinafter) are widely used in devices such as televisions, computers and cellphones due to the advantages thereof such as large size, high degree of integration, powerful functions, flexible manufacture and low cost.

A display panel in a TFT-LCD is typically manufactured by assembling an array substrate and a color film substrate in a cell and providing liquid crystals between the array substrate and the color film substrate. A thin film transistor (TFT) includes a gate electrode, a semiconductor layer, a source electrode and a drain electrode. In the manufacture process of an array substrate, if a TFT thereof is damaged, for example, a gate and a source are shorted (known as DGS), light transmitted through a pixel region including the damaged TFT will be much brighter than light transmitted through a pixel region including a normal TFT, that is, a phenomenon of bright pixel defect (Bright Pixel Defect) will occur, which severely affects quality of the display panel.

SUMMARY

In a first aspect, an array substrate is provided according to embodiments of the present disclosure. The method includes: a plurality of pixel units defined by gate lines and data lines that are crossed, each of the plurality of pixel units includes a pixel electrode and a thin film transistor, and the array substrate further includes: repairing units corresponding to target pixel electrodes in the pixel electrodes. Each of the repairing units is connected to a corresponding target pixel electrode and a corresponding target signal line, and each of the repairing units is configured to control the target pixel electrode and the target signal line that are connected to the repairing unit to be electrically connected to each other or electrically insulated from each other.

In some optional embodiments, in a case that the target pixel electrode is configured to be electrically connected to a corresponding thin film transistor, the repairing unit connected to the target pixel electrode is non-conductive, and the target pixel electrode and the corresponding target signal line are electrically insulated from each other by the non-conductive repairing unit. In a case that the target pixel electrode is configured to be disconnected from the corresponding thin film transistor, the repairing unit connected to the target pixel electrode is conductive, and the target pixel electrode and the corresponding target signal line are electrically connected to each other by the conductive repairing unit.

In some optional embodiments, the array substrate further includes a base substrate, where the repairing units and the pixel electrodes are arranged on the base substrate, and each of the repairing units includes a first repairing pattern and a second repairing pattern that are stacked and an insulation layer arranged between the first repairing pattern and the second repairing pattern. The first repairing pattern is connected to the corresponding target pixel electrode, the second repairing pattern is connected to the corresponding target signal line, and an orthographic projection of the first repairing pattern onto the base substrate at least partially overlaps with an orthographic projection of the second repairing pattern onto the base substrate to form a first overlapped region.

In some optional embodiments, the first repairing pattern or the second repairing pattern, and the insulation layer are meltable at the first overlapped region; or the insulation layer is breakable at the first overlapped region, whereby the first repairing pattern and the second repairing pattern are fused together at the first overlapped region.

In some optional embodiments, each first repairing pattern and a gate layer of the corresponding thin film transistor are formed from a same metal material in one patterning process, and each second repairing pattern and a source-drain layer of the corresponding thin film transistor are formed from a same metal material in one patterning process.

In some optional embodiments, an area of the first overlapped region is larger than or equal to 9 $\mu m^2$.

In some optional embodiments, the orthographic projection of each first repairing pattern onto the base substrate is located within an orthographic projection of a black matrix of the array substrate onto the base substrate; and/or the orthographic projection of each second repairing pattern onto the base substrate is located within the orthographic projection of the black matrix of the array substrate onto the base substrate.

In some optional embodiments, the array substrate further includes connection portions, where each of the thin film transistors is connected to the corresponding pixel electrode by the connection portion; and an orthographic projection of the connection portion corresponding to each of the target pixel electrodes in the pixel electrodes onto a base substrate is non-overlapped with an orthographic projection of the corresponding target signal line onto the base substrate.

In some optional embodiments, the array substrate further includes a common electrode arranged at a side of the pixel electrode facing away from a base substrate of the array substrate, and the target signal line includes a common electrode line connected to the common electrode.

In some optional embodiments, the target signal line is a common electrode line parallel with the data lines.

In some optional embodiments, the insulation layer is made of $Si_xO_y$, $Si_mN_n$ or a mixture of $Si_xO_y$ and $Si_mN_n$, where x, y, m and n are positive integers.

In a second aspect, a display apparatus is further provided according to embodiments of the present disclosure, which includes the above array substrate In a third aspect, a method for manufacturing an array substrate is further provided according to embodiments of the present disclosure. The method includes:

forming gate lines and data lines, and forming a pixel unit in each of a plurality of regions defined by the gate lines and the data lines that are crossed, where the pixel unit includes a pixel electrode and a thin film transistor; and forming repairing units corresponding to target pixel electrodes in the pixel electrodes, where each of the repairing units is connected to a corresponding one of the target pixel electrodes and a corresponding target signal line, and is configured to control the target pixel electrode and the target signal line that are connected to the repairing unit to be electrically connected to each other or electrically insulated from each other.

In some optional embodiments, the method includes: configuring each of the repairing units to be non-conductive in a case that the target pixel electrode is configured to be electrically connected to a corresponding thin film transistor; or configuring each of the repairing units to be conductive in a case that the target pixel electrode is configured to be disconnected from the corresponding thin film transistor.

In some optional embodiments, the array substrate includes a base substrate and a common electrode, the target signal line includes a common electrode line, and the forming the repairing unit includes: forming a first repairing pattern, an insulation layer and a second repairing pattern that are stacked in sequence on the base substrate, where the first repairing pattern is connected to the corresponding target pixel electrode, the second repairing pattern is connected to the corresponding target signal line, and an orthographic projection of the first repairing pattern onto the base substrate at least partially overlaps with an orthographic projection of the second repairing pattern onto the base substrate to form a first overlapped region. The first repairing pattern or the second repairing pattern, and the insulation layer are meltable at the first overlapped region, or the insulation layer is breakable at the first overlapped region.

In some optional embodiments, the method includes:

disconnecting a target pixel electrode to be repaired from a corresponding thin film transistor; and melting the first or the second repairing pattern, and the insulation layer at the first overlapped region by a laser, whereby the first repairing pattern and the second repairing pattern are fused together at the first overlapped region.

In some optional embodiments, the method includes:

forming the first repairing pattern and a gate layer of the thin film transistor in one patterning process; and forming the second repairing pattern, the common electrode line and a source-drain layer of the thin film transistor in one patterning process.

In some optional embodiments, the method includes: forming a black matrix on the base substrate, where the orthographic projection of the first repairing pattern onto the base substrate is located within an orthographic projection of the black matrix of the array substrate onto the base substrate; and/or the orthographic projection of the second repairing pattern onto the base substrate is located within the orthographic projection of the black matrix of the array substrate onto the base substrate.

In some optional embodiments, the target signal line is a common electrode line parallel with the data lines.

BRIEF DESCRIPTION OF THE DRAWINGS

In order to clarify the technical solutions according to the embodiments of the present disclosure or conventional art, the appended drawings involved in the description of the following embodiments are briefly introduced hereinafter. Apparently, the drawings only illustrate some embodiments of the present disclosure, and other drawings may be obtained based on these drawings by those skilled in the art without any inventive efforts.

DETAILED DESCRIPTION

In order to clearly clarify the present disclosure, descriptions are made in conjunction with some optional embodiments and the drawings. Similar parts in different drawings are denoted by same legends. It should be well appreciated by those skilled in the art the following descriptions are intended for purpose of illustration rather than limitation, and the scope of the present discloser is not limited by the descriptions.

In related art, pixel light-out processing is generally performed on a pixel region where a damaged TFT is located, in which a pixel electrode in the pixel region where the damaged TFT is located and a signal line in an array substrate are soldered together so that a potential of the pixel electrode in the pixel region is maintained at a constant low value, to avoid generation of bright pixel defect. Such processing only applies to a pixel structure in which a pixel electrode and a signal line overlap with each other in a direction normal to a base substrate, and for an array substrate without this pixel structure, repairing cannot be performed through the pixel light-out processing as identified above.

Currently, data lines and sub-pixel units in a display panel of a TFT-LCD are connected to each other in a Z-inversion manner, which can achieve low cost and high display quality, and different display technologies are employed to improve a transmittance of the display panel. Commonly used display technologies include advanced super dimension switch (Advanced Super Dimension Switch, abbreviated as ADS hereinafter) technology and inverse advanced super dimension switch (Inverse Advanced Super Dimension Switch, abbreviated as I-ADS hereinafter) technology with a high transmittance improved from ADS, and the difference between I-ADS and ADS display technologies lies in that the two ITO (indium tin oxide) layers thereof have opposite functionalities.

The manufacture process of an ADS array substrate is as described in the following.

Figure 1:
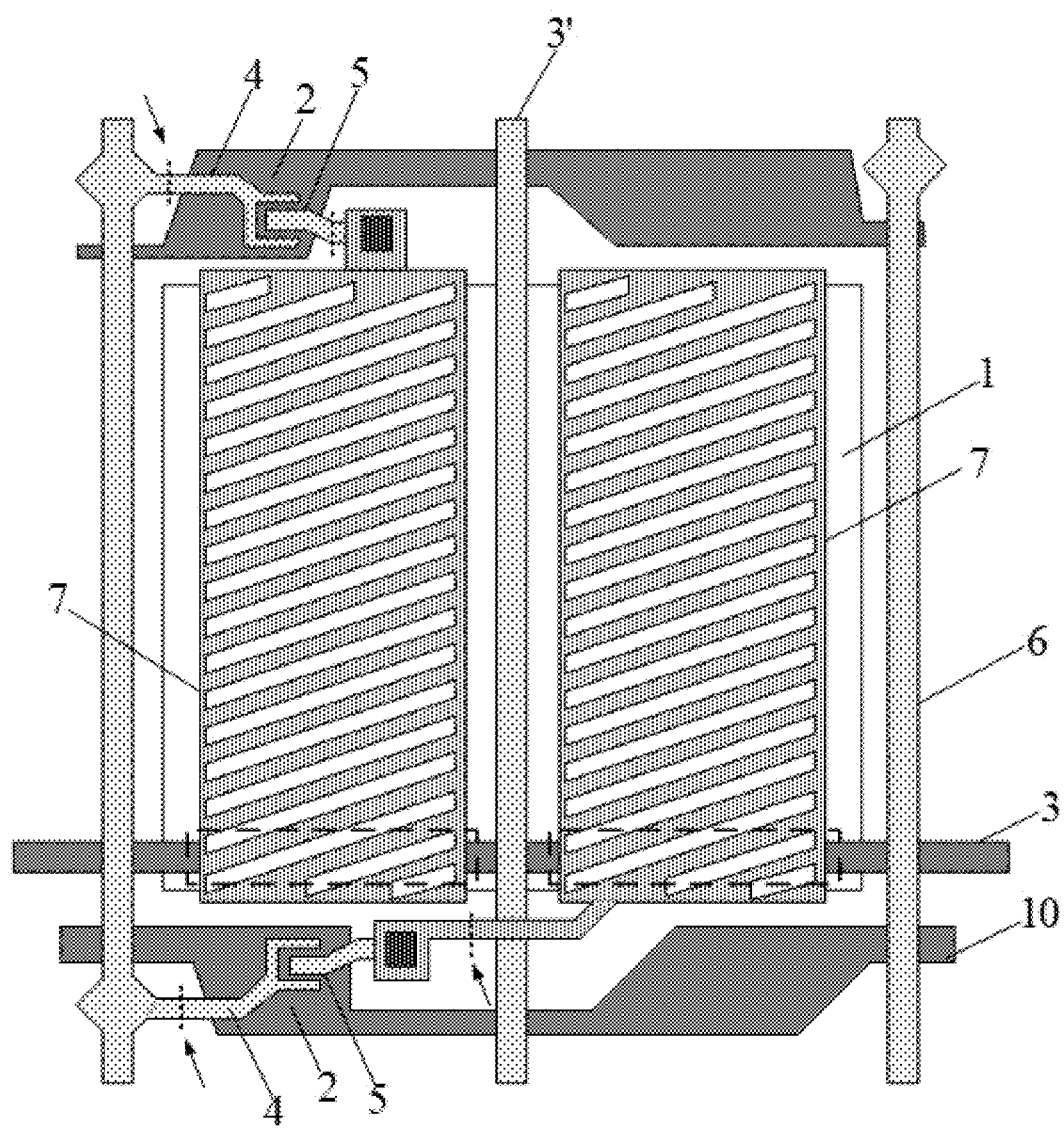
FIG. 1 is a schematic diagram of an ADS array substrate according to an embodiment of the present disclosure.

As shown in FIG. 1, a first ITO layer is formed on a base substrate at first, a common electrode 1 is formed therefrom, and a gate layer 2, a horizontal metal common electrode line 3, a gate line 10 and other signal lines are formed from a metal material on the base substrate with the first ITO layer formed thereon. An insulation layer is formed covering the first ITO layer, the gate layer 2, the horizontal metal common electrode line 3, the gate line 10 and other signal lines, and an active layer is formed on the insulation layer. A source electrode layer 4, a drain electrode layer 5, a data line 6 and a vertical metal common electrode line 3' are formed from a metal material on the active layer, a passivation layer is formed thereafter covering all the film layers formed on the base substrate, a second ITO layer is formed on the passivation layer, and a pixel electrode 7 is formed therefrom.

The above ADS array substrate mainly has the following characteristics.

First, the common electrode 1 is formed in the first ITO layer, the pixel electrode 7 is formed in the second ITO layer, and the second ITO layer uses a slotted design and forms a fringe electric field with the common electrode 1 to control deflection of liquid crystal molecules in the display panel.

Second, the horizontal metal common electrode line 3 is formed in the same layer with the gate layer 2, and may be covered by a black matrix in the array substrate, which keeps an aperture ratio and a transmittance of the display panel unchanged.

For an ADS array substrate, the periphery of a pixel electrode or a common electrode is closed, and therefore, liquid crystal molecules at the periphery of the pixel electrode or the common electrode cannot be deflected properly as no effective electric field is formed at the periphery. As a consequence, the periphery remains a dark region in a case of 255 gray degrees, which adversely affects an effective aperture ratio and luminous efficiency of a pixel unit and increases a backlight power consumption of the display panel.

The manufacture process of an I-ADS array substrate is as described in the following.

Figure 2:
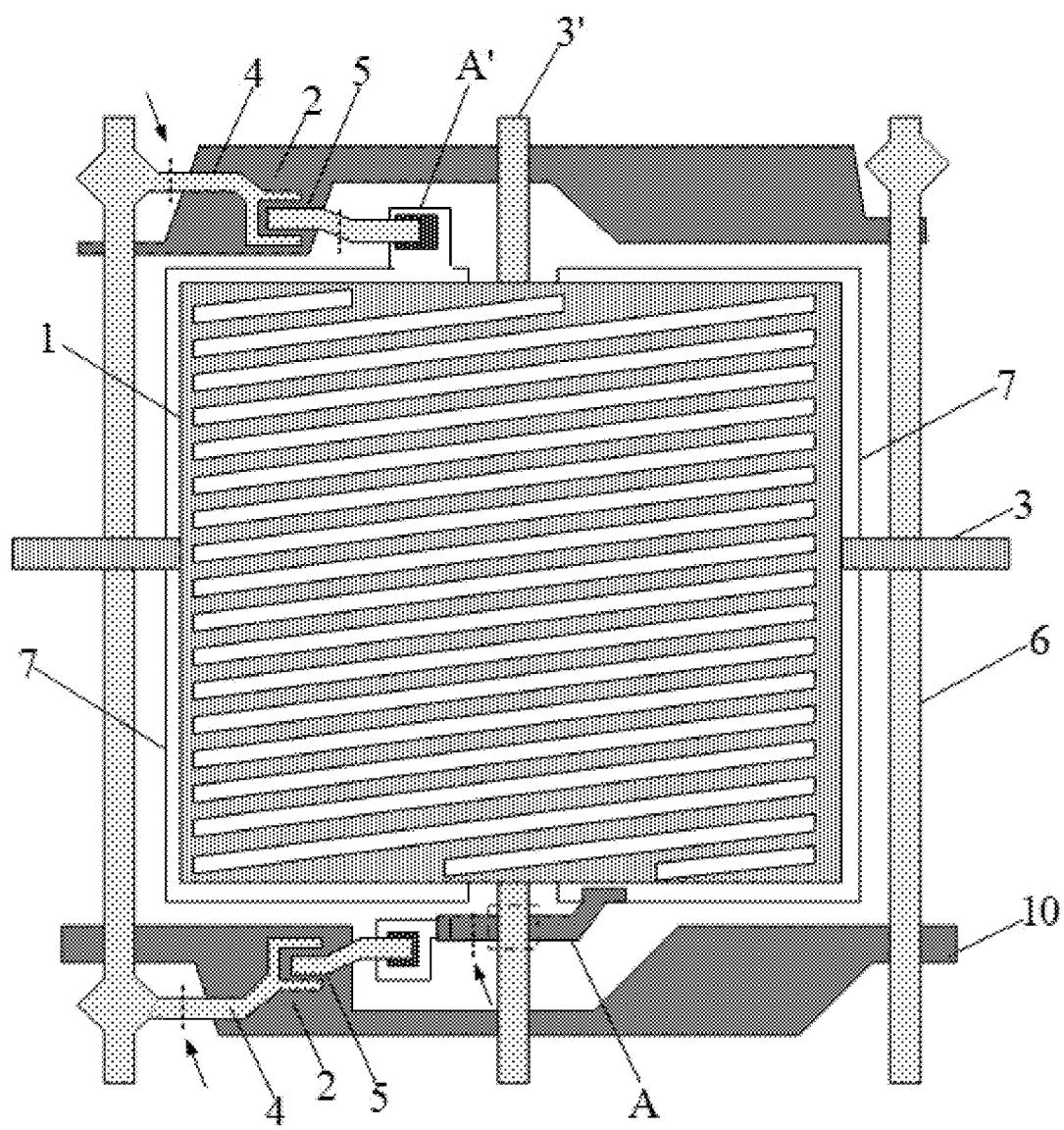
FIG. 2 is a schematic diagram of an I-ADS array substrate according to an embodiment of the present disclosure.

As shown in FIG. 2, a first ITO layer is formed on a base substrate, to form a pixel electrode layer including multiple pixel electrodes 7, where the pixel electrodes 7 are in one-to-one correspondence with sub-pixels and function independently from each other. A gate layer 2, a gate line 10 and other signal lines are thereafter formed from a metal material on the base substrate with the first ITO layer formed thereon, and an insulation layer covering the first ITO layer, the gate layer 2, the gate line 10 and other signal lines is formed thereafter. An active layer is formed on the insulation layer, and a source electrode layer 4, a drain electrode layer 5 and a vertical metal common electrode line 3' are formed from a metal material on the active layer. A passivation layer which covers all the film layers formed on the base substrate is formed thereafter, and a second ITO layer is formed on the passivation layer to form a common electrode 1 and a horizontal common electrode line 3.

The above I-ADS array substrate mainly has the following characteristics.

First, the pixel electrode 7 is formed in the first ITO layer, the common electrode 1 is formed in the second ITO layer of a slotted design, and the common electrode significantly extends to under a black matrix of the display panel, which fully utilizes a fringe electric field formed with the pixel electrode 7 to control deflection of liquid crystal molecules, thereby improving luminous efficiency of a pixel unit and decreasing a backlight power consumption of the display panel; and Second, the common electrode 1 and the horizontal common electrode line 3 are both formed in the second ITO layer, that is, the common electrode 1 and the horizontal common electrode line 3 are arranged in the same layer and connected to each other.

It is clear from the comparison above between the ADS array substrate and the I-ADS array substrate that the functionalities of the two ITO layers in the I-ADS array substrate are interchanged as compared with the ADS array substrate, where the first ITO layer serves as a pixel electrode layer, and the second ITO layer of a slotted design serves as a common electrode layer and may significantly extend to under the black matrix of the display panel, effectively reducing a blind area of electric field and improving luminous efficiency of the display panel.

During manufacture process of the display panel of the TFT-LCD, a gate and a source in a thin film transistor may be shorted with each other (known as DGS) due to particles. When DGS occurs, a method for repairing an ADS array substrate is described in the following. As shown in FIG. 1, since an orthographic projection of each pixel electrode 7 onto the base substrate of the array substrate at least partially overlaps with an orthographic projection of the horizontal metal common electrode line 3 onto the base substrate, during repairing, the TFT with DGS is disconnected from the pixel electrode and the signal line of the display panel (as denoted by the arrow in FIG. 1), to isolate the TFT so as to avoid bad influence from the TFT on the array substrate. A pixel electrode 7 corresponding to the TFT and the horizontal metal common electrode line 3 are fused together at the two dotted boxes as shown in FIG. 1 to pull a potential of the pixel electrode 7 corresponding to the TFT to a potential of the common electrode 1. As can be seen from the above, since in the ADS array substrate, each pixel electrode 7 at least partially overlaps with the horizontal metal common electrode line 3 in a direction normal to the base substrate, a sub-pixel including the pixel electrode can be repaired in a case that a TFT corresponding to any pixel electrode 7 in the array substrate is damaged.

In the I-ADS array substrate, no horizontal common electrode line 3 is formed from the same material and in the same layer with the gate layer 2. As shown in FIG. 2, in a case that DGS occurs in a TFT in the I-ADS array substrate, only some sub-pixels can be repaired by fusing a pixel electrode 7 thereof (for example, the pixel electrode 7 at the right in FIG. 2) with the vertical common electrode line 3' at the dotted box in FIG. 2 through a connection line A connected to the pixel electrode 7, while other sub-pixels are unrepairable as a pixel electrode thereof (for example, the pixel electrode 7 at the left in FIG. 2) is connected to a corresponding TFT through a connection line A' which does not no overlap with the vertical common electrode line 3' in the direction normal to the base substrate, lowering a yield of the display panel. Taking B855UHD Dual Gate WRGB display panels for example, a proportion of unrepairable bright pixel ranges from 2% to 2.5%, and a loss of 2250 Pcs of panels is incurred per month in a case of an estimated production of 15 k large boards per month, resulting in a big economic loss.

In view of the above, technical solutions are provided according to the embodiments of the present disclosure, to repair a display panel with any pixel structure in any display technology when a bright pixel defect occurs.

Figure 3:
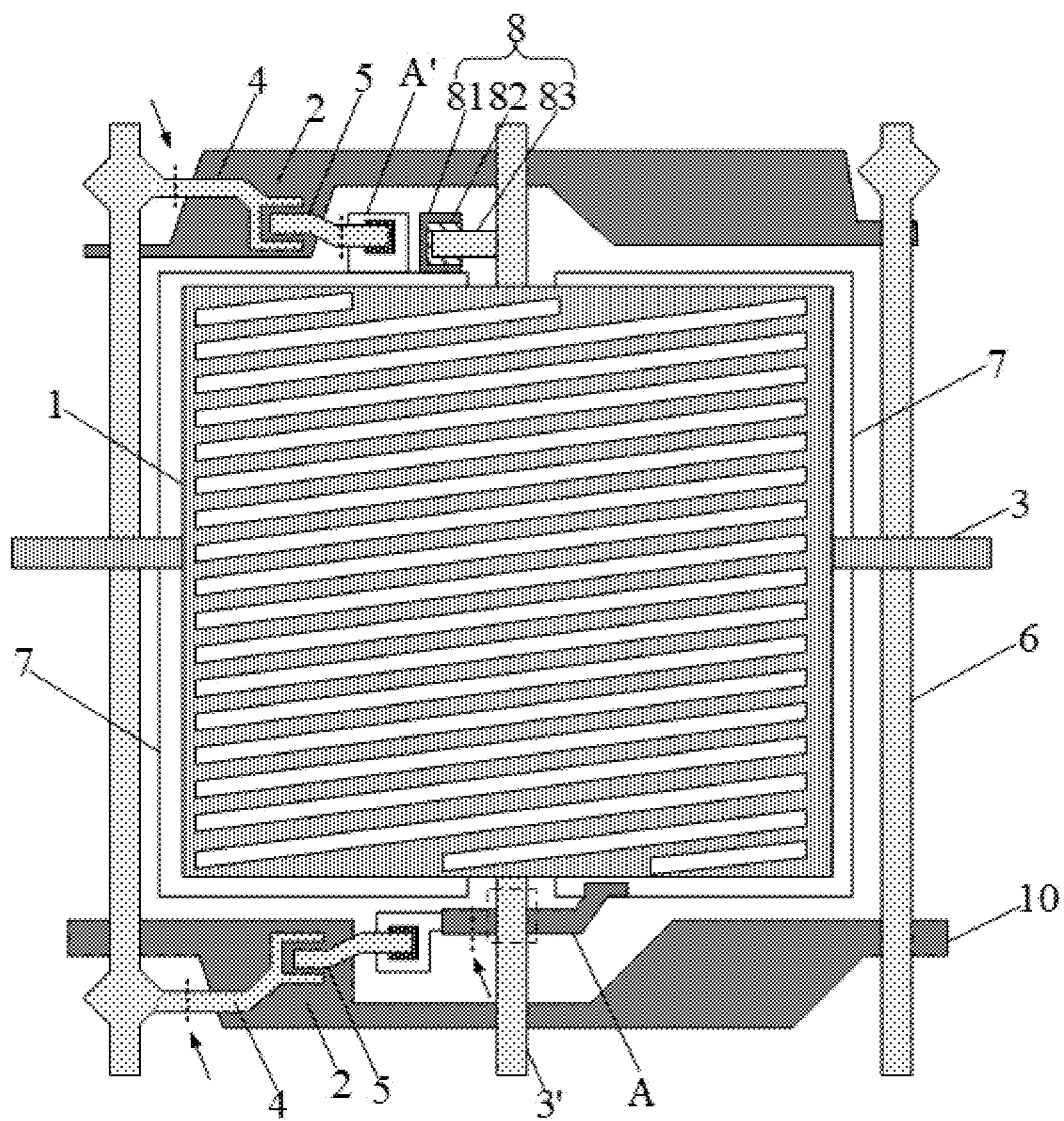
FIG. 3 is a schematic diagram of an array substrate according to an embodiment of the present disclosure.

With reference to FIG. 3, an array substrate is provided according to an embodiment of the present disclosure, which includes multiple pixel units defined by crossing of gate lines 10 and data lines 6, where each pixel unit includes a pixel electrode 7 and a thin film transistor. The array substrate further includes multiple repairing units 8 connected in one-to-one correspondence with target pixel electrodes in the pixel electrodes 7, and each repairing unit 8 is connected to a corresponding target pixel electrode and a corresponding target signal line, and is configured to insulate the target pixel electrode connected to the repairing unit 8 from the target signal line connected to the repairing unit 8.

An array substrate is further provided according to an embodiment of the present disclosure, which includes multiple pixel units defined by crossing of gate lines 10 and data lines 6, where each pixel unit includes a pixel electrode 7 and a thin film transistor. The array substrate further includes multiple repairing units 8 connected in one-to-one correspondence with target pixel electrodes in the pixel electrodes 7, and each repairing unit 8 is connected to a corresponding target pixel electrode and a corresponding target signal line, and is configured to connect the target pixel electrode connected to the repairing unit 8 to the target signal line connected to the repairing unit 8.

The array substrates according to the two embodiments above both include a common electrode line, multiple gate lines 10 and multiple data lines 6, and the multiple gate lines 10 and the multiple data lines 6 cross with each other to define multiple pixel units. Each pixel unit includes a pixel electrode 7 and a thin film transistor, and the thin film transistor is connected to the pixel electrode 7 and is configured to provide signals for the pixel electrode 7.

Pixel structures of the substrates according to the two embodiments above may be varied. In some optional embodiments, the pixel electrodes 7 in the substrate are connected in one-to-one correspondence with thin film transistors through respective connections portions. An orthographic projection of a first connection portion A (which may be formed from a same material and in a same layer with a gate layer 2) corresponding to a first pixel electrode 7 onto a base substrate of the array substrate may partially overlap with an orthographic projection of a vertical common electrode line 3' onto the base substrate at, for example, the dotted box in FIG. 3, and an orthographic projection of a second connection portion A' (which may be formed from a same material and in a same layer with a source electrode layer 4 and a drain electrode layer 5) corresponding to a second pixel electrode 7 onto the base substrate does not overlap with an orthographic projection of the vertical common electrode line 3' onto the base substrate. Since the orthographic projection of the second connection portion A' corresponding to the second pixel electrode 7 onto the base substrate does not overlap with that of the vertical common electrode line 3' onto the base substrate, the second connection portion A' corresponding to the second pixel electrode 7 cannot be fused with the corresponding vertical common electrode line 3' in a case that a corresponding TFT is damaged, rendering a sub-pixel including the second pixel electrode unrepairable.

The second pixel electrode is defined as a target pixel electrode, that is, a pixel electrode to be repaired, and the vertical common electrode line 3' is defined as a target signal line. Multiple repairing units 8 corresponding to the target pixel electrodes may be provided in the array substrate, and each repairing unit 8 is connected to a corresponding target signal line and a corresponding target pixel electrode. It should be noted that the target signal line is not limited to the vertical common electrode line 3' but may be any other signal line such as a reference signal line in an array substrate.

In practical application, in a case that the target pixel electrode in the array substrate is operating normally, a corresponding repairing unit 8 is configured to electrically insulate the target pixel electrode connected to the repairing unit 8 from the target signal line, and in a case that the target pixel electrode in the array substrate needs to be repaired, for example, in a case that a voltage across a target pixel unit is abnormal due to abnormal operating of a thin film transistor connected to the target pixel electrode, the corresponding repairing unit 8 is configured to electrically connect the target pixel electrode connected to the repairing unit 8 to the target signal line, so as to pull a potential of the target pixel electrode to a potential of the target signal line and thus perform pixel light-out processing on a sub-pixel corresponding to the target pixel electrode, thereby achieving repairing of the sub-pixel corresponding to the target pixel electrode.

As manifested by the structure and the repairing method of the array substrate above, repairing units 8 corresponding to the target pixel electrodes are provided in the array substrate, and each repairing unit 8 is connected to a target pixel electrode and a target signal line. The repairing unit 8 controls the target pixel electrode to be electrically insulated from the target signal line in a case that the target pixel electrode is in normal operation, and controls the target pixel electrode to be electrically connected to the target signal line to repair a sub-pixel corresponding to the target pixel electrode in a case that the target pixel electrode needs repairing. Thus, pixel light-out processing may be performed on a sub-pixel in the array substrate according to the embodiments of the present disclosure with the repairing unit 8 regardless of whether the array substrate is an ADS or I-ADS array substrate or what pixel structure the arrays substrate has.

Figure 4:
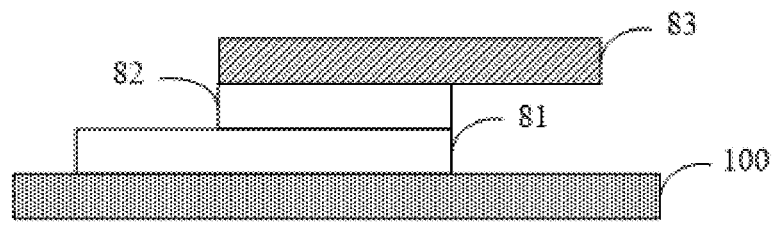
FIG. 4 is a schematic diagram of a repairing unit in an array substrate according to an embodiment of the present disclosure.

The repairing unit 8 above may be varied in respect of structure. In some optional embodiments, as shown in FIG. 4, the repairing unit above includes a first repairing pattern 81 and a second repairing pattern 83 that are stacked, and an insulation layer 82 between the first repairing pattern 81 and the second repairing pattern 83. The first repairing pattern 81 is connected to a corresponding target pixel electrode, and the second repairing pattern 83 is connected to a corresponding target signal line. An orthographic projection of the first repairing pattern 81 onto the base substrate 100 and that of the second repairing pattern 83 onto the base substrate 100 overlap with each other at a first overlapped region.

In some optional embodiments, the insulation layer 82 is made of $Si_xO_y$, $Si_mN_n$ or a mixture of $Si_xO_y$ and $Si_mN_n$, where x, y, m and n are positive integers.

In a case that the repairing unit 8 is configured to control the target pixel electrode connected to the repairing unit to be electrically insulated from the target signal line, the insulation layer 82 is controlled not to be melted so that the first repairing pattern 81 and the second repairing pattern 83 are electrically insulated from each other.

Figure 5:
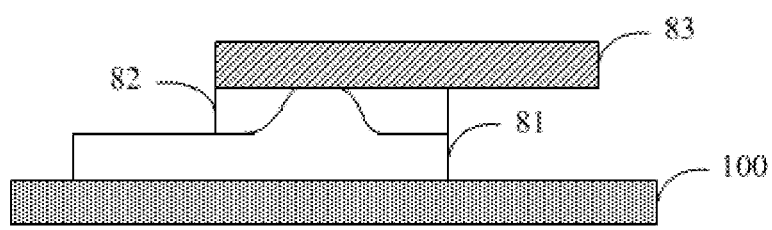
FIG. 5 is a schematic diagram of a repairing unit in an array substrate according to an embodiment of the present disclosure.

As shown in FIG. 5, in a case that the repairing unit 8 is configured to control the target pixel electrode to be electrically connected to the target signal line, the insulation layer 82 and the first repairing pattern 81 are melted at the first overlapped region so that the first repairing pattern 81 and the second repairing pattern 83 are fused together at the first overlapped region.

Figure 6:
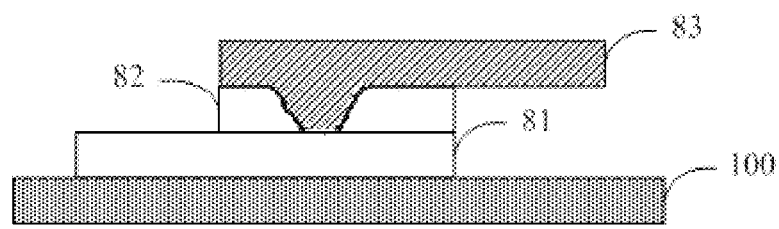
FIG. 6 is a schematic diagram of a repairing unit in an array substrate according to an embodiment of the present disclosure.

In some optional embodiments, as shown in FIG. 6, the insulation layer 82 and the second repairing pattern 83 are melted at the first overlapped region so that the first repairing pattern 81 and the second repairing pattern 83 are fused together at the first overlapped region, while the first repairing pattern 81 is not melted.

By configuring the repairing unit 8 with the structure above, the first repairing pattern 81 and the second repairing pattern 83 in the repairing unit 8 are electrically insulated from each other by the insulation layer 82 in a case that the target pixel electrode is in normal operation, so that the target pixel electrode connected to the first repairing pattern 81 and the target signal line connected to the second repairing pattern 83 are insulated from each other, and a voltage is still provided for the target pixel electrode via the corresponding thin film transistor. In a case that the potential of the target pixel electrode is abnormal due to abnormal operating of the thin film transistor corresponding to the target pixel electrode, the abnormal thin film transistor is disconnected first, for example, at the dotted line denoted by the arrow as shown in FIG. 3, and the first repairing pattern 81 and the second repairing pattern 83 are fused together at the first overlapped region thereafter, so that the target pixel electrode connected to the first repairing pattern 81 is connected to the target signal line connected to the second repairing pattern 83 to pull the potential of the target pixel electrode to that of the target signal line, rendering the sub-pixel corresponding to the target pixel electrode an acceptable dark pixel.

By configuring the repairing unit 8 with the above structure, the repairing unit 8 has no influence on normal operating of the target pixel unit in a case that the target pixel electrode is in normal operation, ensuring normal operating of the target pixel electrode. In a case that the target pixel electrode is abnormal and needs repairing, the pixel electrode can be repaired just by fusing the first repairing pattern 81 with the second repairing pattern 83, which is simple in execution and has no bad influence on the target pixel electrode. In addition, such structure provides a simple manufacture for the repairing unit 8, that is, the repairing unit 8 can be formed just by forming the first repairing pattern 81, the insulation layer 82 and the second repairing pattern 83 with simple patterning processes.

In some optional embodiments, in order to avoid influence on a target pixel electrode and a target signal line near a melted region when repairing the target pixel electrode, a position of melting is arranged within the first overlapped region where the first repairing pattern 81 and the second repairing pattern 83 overlap with each other, and a sufficient area for melting is reserved in the first overlapped region. Optionally, an area of the first overlapped region is at least 9 $\mu m^2$, to ensure the first repairing pattern 81 and the second repairing pattern 83 to be well fused together.

In some optional embodiments, the first overlapped region is rectangular, which for example, has dimensions of 3×3 $\mu m^2$ or 5×5 $\mu m^2$, thereby facilitating full fusion of the first repairing pattern 81 and the second repairing pattern 83.

In some optional embodiments, the orthographic projection of the first repairing pattern 81 of the repairing unit 8 onto the base substrate is located within an orthographic projection of a black matrix of the array substrate onto the base substrate; and/or the orthographic projection of the second repairing pattern 83 onto the base substrate is located within the orthographic projection of the black matrix of the array substrate onto the base substrate.

In this way, at least one of the first repairing pattern 81 and the second repairing pattern 83 is blocked by the black matrix of the array substrate, so that the repairing unit 8 has no negative influence on an aperture ratio and a transmittance of the array substrate, thereby having good technical effects and applicability.

Further, in the array substrate according to the embodiment above, each thin film transistor is connected to a corresponding pixel electrode through a connection portion, and is configured to provide voltage signals for the corresponding pixel electrode. The orthographic projection of the second connection portion A' corresponding to the target pixel electrode (for example, the pixel electrode at the left in FIG. 3) onto the base substrate does not overlap with that of the target signal line (for example, the vertical common electrode line 3' in FIG. 3) onto the base substrate. The pixel electrodes further include a non-target pixel electrode (for example, the pixel electrode at the right in FIG. 3), and the orthographic projection of the first connection portion A corresponding to the non-target pixel electrode onto the base substrate at least partially overlaps with that of the target signal line (for example, the vertical common electrode line 3' in FIG. 3) onto the base substrate.

Specifically, the array substrate includes target pixel electrodes and non-target pixel electrodes, where each target pixel electrode corresponds to at least one repairing unit 8. In a case that a target pixel electrode needs repairing, a thin film transistor connected to the target pixel electrode is disconnected, and thereafter the target pixel electrode is repaired through a corresponding repairing unit 8. In a case that a non-target pixel electrode needs repairing, a thin film transistor corresponding to the non-target pixel electrode is disconnected, and thereafter a first connection portion A corresponding to the non-target pixel electrode is fused with the target signal line, for example, at the dotted box in FIG. 3, to pull a potential of the non-target pixel electrode to a potential of the target pixel electrode, thereby repairing the non-target pixel electrode.

It can be seen from the above that in the array substrate according to the embodiments of the present disclosure, repairing units 8 may be provided only for target pixel electrodes rather than all pixel electrodes in view of the practical pixel structure, to repair all the pixel electrodes in a case that a display failure occurs. In this way, the manufacture cost is lowered maximumly with all pixel electrodes in the array substrate being repairable.

Further, the array substrate also includes a slot-like common electrode 1, which is located at a side of the pixel electrode facing away from the base substrate, and the target signal line includes a common electrode line connected to the common electrode 1.

As shown in FIG. 3, the array substrate may be an I-ADS array substrate, that is, the common electrode 1 in the array substrate is arranged at a side of the pixel electrode 7 facing away from the base substrate and is provided slots therein. The array substrate configured with such a structure includes a vertical common electrode line 3' between the pixel electrode 7 and the common electrode 1, and the vertical common electrode line 3' may function as the target signal line, where the pixel electrode 7 to be repaired is connected to the vertical common electrode line 3' through the repairing unit 8, thereby achieving repairing of the array substrate.

Further, the first repairing pattern 81 in the repairing unit 8 above is formed from a same material and in a same layer with the gate layer 2 of the thin film transistor, and the second repairing pattern 83 is formed from a same material and in a same layer with a source-drain layer (including the source electrode layer 4 and the drain electrode layer 5) of the thin film transistor.

By forming the first repairing pattern 81 from the same material and in the same layer with the gate layer 2 of the thin film transistor, the gate layer 2 and the first repairing pattern 81 are formed in one patterning process; and by forming the second repairing pattern 83 from the same material and in the same layer with the source-drain layer of the thin film transistor, the source-drain layer, the second repairing pattern 83 and the common electrode line are formed in one patterning process, thereby avoiding additional manufacture processes for the first repairing pattern 81 and the second repairing pattern 83. It should be noted that the common electrode line may be the vertical common electrode line 3' in a case of I-ADS array substrate. In addition, the source-drain layer above may be a metal source-drain layer, which, notwithstanding, is not limited in the present disclosure.

It is to be noted that the insulation layer 82 in the repairing unit 8 may be formed from a same material and in a same layer with any other insulation layer in the array substrate, and in this way, the insulation layer 82 in the repairing unit 8 and another insulation layer in the array substrate are formed in one patterning process without providing an additional manufacture process for the insulation layer 82. For example, the insulation layer 82 may be formed from a same material with an insulation layer between the gate layer and an active layer of the thin film transistor in one patterning process. The one patterning process refers to one masking process.

A display apparatus is further provided according to an embodiment of the present disclosure, which includes the array substrate according to the embodiments above.

In the array substrate according to the embodiments of the present disclosure, the repairing unit 8 is provided, so that pixel light-out processing can be performed no matter what pixel structure the array substrate has. Therefore, the display apparatus according to the embodiment of the present disclosure has all the beneficial effects of the array substrate above by merits of inclusion of the same, which is not described herein redundantly.

A method for manufacturing an array substrate is further provided according to an embodiment of the present disclosure, which is used to manufacture the array substrate according to the embodiments above. The method includes:

forming gate lines 10 and data lines 6, and forming pixel units in multiple regions defined by crossed the gate lines 10 and the data lines 6, where each pixel unit includes a pixel electrode 7 and a thin film transistor; and forming repairing units 8 corresponding to target pixel electrodes in the pixel electrodes 7, where each repairing unit 8 is connected to a corresponding target pixel electrode and a corresponding target signal line in multiple target signal lines and is configured to control the target pixel electrode and the target signal line which are connected to the repairing unit to be electrically connected to each other or electrically insulated from each other.

Specifically, multiple gate lines 10 and multiple data lines 6 are formed on a base substrate, and multiple regions are defined by the crossed the multiple gate lines 10 and multiple data lines 6. A pixel unit is formed in each of the multiple regions, and each pixel unit includes a pixel electrode 7 and a thin film transistor. The thin film transistor is connected to the pixel electrode 7 and provides signals for the pixel electrode 7. Multiple repairing units 8 corresponding target pixel electrodes in the pixel electrode 7 are formed, where each repairing unit 8 is connected to a corresponding target pixel electrode and one of multiple signal lines.

Further, the method for manufacturing an array substrate also includes: forming a first repairing pattern, an insulation layer and a second repairing pattern that are stacked in sequence on the base substrate, where the first repairing pattern is connected to a corresponding target pixel electrode, the second repairing pattern is connected to a corresponding target signal line, and an orthographic projection of the first repairing pattern onto the base substrate at least partially overlaps with an orthographic projection of the second repairing pattern onto the base substrate so as to form a first overlapped region; and the first repairing pattern or the second repairing pattern, and the insulation layer are meltable at the first overlapped region, so that the first repairing pattern and the second repairing pattern can be fused together at the first overlapped region.

Specifically, in practical application of the array substrate as manufactured above, in a case that the target pixel electrode is in normal operation, a corresponding repairing unit electrically insulates the target pixel electrode from the target signal line, and in a case that the target pixel electrode needs repairing, the target pixel electrode and the target signal line can be connected to each other by the corresponding repairing unit 8 so as to pull a potential of the target pixel electrode to a potential of the target signal line, to perform pixel light-out processing on a sub-pixel corresponding to the target pixel electrode, thereby achieving repairing of the sub-pixel corresponding to the target pixel electrode.

The array substrate as manufactured by the method according to the embodiment above includes a repairing unit 8 corresponding to a target pixel electrode, where the repairing unit 8 is connected to the target pixel electrode and a target signal line, controls the target pixel electrode to be disconnected from the target signal line in a case that the target pixel electrode is in normal operation, and connects the target pixel electrode to the target signal line in a case that the target pixel electrode needs repairing so as to repair a sub-pixel corresponding to the target pixel electrode. Thus, pixel light-out processing can be performed on the sub-pixel with the repairing unit 8 in the array substrate manufactured by the method according to the embodiment of the present disclosure regardless of pixel structure.

Further, in a case that the array substrate includes a common electrode 1, the target signal line includes a common electrode line, and the repairing unit 8 includes a first repairing pattern 81, a second repairing pattern 83 and an insulation layer, the step of forming the repairing unit 8 includes:

forming the first repairing pattern 81 and a gate layer 2 of the thin film transistor in one patterning process; and forming the second repairing pattern 83, the common electrode line and a source-drain layer of the thin film transistor in one patterning process.

Specifically, the repairing unit 8 includes a first repairing pattern 81, a second repairing pattern 83 and an insulation layer 82, the first repairing pattern 81 and a gate layer 2 of the thin film transistor may be formed in a single patterning process, and the second repairing pattern 83, the common electrode line and a source-drain layer of the thin film transistor may be formed in another single patterning process, thereby avoiding additional manufacture processes for the first repairing pattern 81 and the second repairing pattern 83. It should be noted that the common electrode line may be the vertical common electrode line 3' in a case of I-ADS array substrate.

In addition, the insulation layer 82 of the repairing unit 8 may be formed from a same material and in a same layer with any other insulation layer in the array substrate, and in this way, the insulation layer 82 in the repairing unit 8 and another insulation layer in the array substrate can be formed in one patterning process without providing an additional manufacture process for the insulation layer 82.

In some optional embodiments, the method according to the embodiment above further includes:

disconnecting a target pixel electrode to be repaired from a corresponding thin film transistor; and melting the first or the second repairing pattern, and the insulation layer at the first overlapped region by a laser, to fuse the first and the second repairing patterns together at the first overlapped region.

Specifically, the first repairing pattern 81 and the second repairing pattern 83 may be fused together at the first overlapped region in a direction normal to the base substrate by laser radiation, to electrically connect the first repairing pattern 81 and the second repairing pattern 83 to each other, thereby achieving repairing of the sub-pixel corresponding to the target pixel electrode. In addition, a metal material such as tungsten powder may be applied to the first overlapped region during the fusing process, thereby achieving better fusion effects.

In some optional embodiments, the method includes: configuring the repairing unit to be non-conductive in a case that the target pixel electrode is electrically connected to a corresponding thin film transistor; or configuring the repairing unit to be conductive in a case that the target pixel electrode is disconnected from the corresponding thin film transistor.

In some optional embodiments, the configuring the repairing unit includes breaking down the insulation layer 82 so as to electrically connect the first repairing pattern 81 and the second repairing pattern 83 to each other. The breakdown insulation layer 82 is equivalent to a conductor, so that the target pixel electrode connected to the first repairing pattern 81 and the target signal line connected to the second repairing pattern 83 are electrically connected to each other.

It should be noted that the structure of the repairing unit and the way to treat it conductive are not limited to the two solutions as identified above, and any other structure of the repairing unit and solutions to treat the repairing unit conductive shall also fall within the scope of the present disclosure.

In the method for manufacturing an array substrate according to the embodiments above of the present disclosure, repairing units 8 corresponding to the target pixel electrodes are provided, and each repairing unit 8 is connected to a target pixel electrode and a target signal line. The repairing unit 8 controls the target pixel electrode to be electrically insulated from the target signal line in a case that the target pixel electrode is in normal operation, and controls the target pixel electrode to be electrically connected to the target signal line to repair a sub-pixel corresponding to the target pixel electrode in a case that the target pixel electrode needs repairing. Thus, pixel light-out processing can be performed on a sub-pixel in the array substrate according to the embodiments of the present disclosure with the repairing unit 8 regardless of whether the array substrate is an ADS or I-ADS array substrate or what pixel structure the arrays substrate has.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, but are merely used to distinguish different components. Such terms as "including", or "comprising" and the like mean that an element or an article preceding the term contains elements or items and equivalents thereof behind the term, but does not exclude other elements or items. Such terms as "connected", or "interconnected" and the like are not limited to physical or mechanical connections, but may include electrical connections, whether direct connection or indirect connection. Such terms as "on", "under", "left", "right" and the like are only used to represent a relative position relationship, and when an absolute position of a described object is changed, the relative position relationship thereof may also be changed accordingly.

It shall be understood that when an element such as a layer, a film, a region or a substrate is referred to as being "on" or "under" another element, the element may be "directly" "on" or "under" the another element, or there may exist an intervening element.

The specific characteristics, structures, materials or features according to the foregoing embodiments may be combined in appropriate manners in any one or more embodiments or examples.

The above embodiments are merely optional embodiments of the present disclosure, which impose no limitation on the scope of the present disclosure. It should be noted that numerous improvements and modifications may be made by those skilled in the art without departing from the principle of the present disclosure, and these improvements and modifications shall also fall within the scope of the present disclosure. Therefore, the scope of the present disclosure shall be defined by the appended claims.

What is claimed is:

1. An array substrate, comprising a plurality of pixel units defined by gate lines and data lines that are crossed, wherein each of the plurality of pixel units comprises a pixel electrode and a thin film transistor, and the array substrate further comprises:
   a base substrate; and
   repairing units corresponding to target pixel electrodes in the pixel electrodes, wherein each of the repairing units is connected to a corresponding target pixel electrode and a corresponding target signal line, and each of the repairing units is configured to control the target pixel electrode and the target signal line that are connected to the repairing unit to be electrically connected to each other or electrically insulated from each other,
   wherein the repairing units and the pixel electrodes are arranged on the base substrate, and each of the repairing units comprises a first repairing pattern and a second repairing pattern that are stacked and an insulation layer arranged between the first repairing pattern and the second repairing pattern; and
   the first repairing pattern is connected to the corresponding target pixel electrode, the second repairing pattern is connected to the corresponding target signal line, and an orthographic projection of the first repairing pattern onto the base substrate at least partially overlaps with an orthographic projection of the second repairing pattern onto the base substrate to form a first overlapped region.

2. The array substrate according to claim 1, wherein in a case that the target pixel electrode is configured to be electrically connected to a corresponding thin film transistor, the repairing unit connected to the target pixel electrode is non-conductive, and the target pixel electrode and the corresponding target signal line are electrically insulated from each other by the non-conductive repairing unit; and
   in a case that the target pixel electrode is configured to be disconnected from the corresponding thin film transistor, the repairing unit connected to the target pixel electrode is conductive, and the target pixel electrode and the corresponding target signal line are electrically connected to each other by the conductive repairing unit.

3. The array substrate according to claim 1, wherein each first repairing pattern and a gate layer of the corresponding thin film transistor are formed from a same metal material in one patterning process, and each second repairing pattern and a source-drain layer of the corresponding thin film transistor are formed from a same metal material in one patterning process.

4. The array substrate according to claim 1, wherein an area of the first overlapped region is larger than or equal to 9 µm².

5. The array substrate according to claim 1, wherein the orthographic projection of each first repairing pattern onto the base substrate is located within an orthographic projection of a black matrix of the array substrate onto the base substrate; and/or the orthographic projection of each second repairing pattern onto the base substrate is located within the orthographic projection of the black matrix of the array substrate onto the base substrate.

6. The array substrate according to claim 1, further comprising connection portions, wherein each of the thin film transistors is connected to the corresponding pixel electrode by the connection portion; and
an orthographic projection of the connection portion corresponding to each of the target pixel electrodes in the pixel electrodes onto a base substrate is non-overlapped with an orthographic projection of the corresponding target signal line onto the base substrate.

7. The array substrate according to claim 1, further comprising a common electrode arranged at a side of the pixel electrode facing away from a base substrate of the array substrate,
wherein the target signal line comprises a common electrode line connected to the common electrode.

8. The array substrate according to claim 7, wherein the target signal line is a common electrode line parallel with the data lines.

9. The array substrate according to claim 1, wherein the insulation layer is made of $Si_xO_y$, $Si_mN_n$ or a mixture of $Si_xO_y$ and $Si_mN_n$, wherein x, y, m and n are positive integers.

10. A display apparatus comprising the array substrate according to claim 1.

11. A method for manufacturing an array substrate, comprising:
forming gate lines and data lines, and forming a pixel unit in each of a plurality of regions defined by the gate lines and the data lines that are crossed, wherein the pixel unit comprises a pixel electrode and a thin film transistor; and
forming repairing units corresponding to target pixel electrodes in the pixel electrodes, wherein each of the repairing units is connected to a corresponding one of the target pixel electrodes and a corresponding target signal line, and is configured to control the target pixel electrode and the target signal line that are connected to the repairing unit to be electrically connected to each other or electrically insulated from each other,
wherein the array substrate comprises a base substrate and a common electrode, the target signal line comprises a common electrode line, and the forming the repairing unit comprises:
forming a first repairing pattern, an insulation layer and a second repairing pattern that are stacked in sequence on the base substrate, wherein the first repairing pattern is connected to the corresponding target pixel electrode, the second repairing pattern is connected to the corresponding target signal line, and an orthographic projection of the first repairing pattern onto the base substrate at least partially overlaps with an orthographic projection of the second repairing pattern onto the base substrate to form a first overlapped region;
wherein the first repairing pattern or the second repairing pattern, and the insulation layer are meltable at the first overlapped region, or the insulation layer is breakable at the first overlapped region.

12. The method according to claim 11, comprising:
configuring each of the repairing units to be non-conductive in a case that the target pixel electrode is configured to be electrically connected to a corresponding thin film transistor; or configuring each of the repairing units to be conductive in a case that the target pixel electrode is configured to be disconnected from the corresponding thin film transistor.

13. The method according to claim 11, further comprising:
disconnecting a target pixel electrode to be repaired from a corresponding thin film transistor; and
melting the first or the second repairing pattern, and the insulation layer at the first overlapped region by a laser, whereby the first repairing pattern and the second repairing pattern are fused together at the first overlapped region.

14. The method according to claim 11, further comprising:
forming the first repairing pattern and a gate layer of the thin film transistor in one patterning process; and
forming the second repairing pattern, the common electrode line and a source-drain layer of the thin film transistor in one patterning process.

15. The method according to claim 11, further comprising:
forming a black matrix on the base substrate, wherein the orthographic projection of the first repairing pattern onto the base substrate is located within an orthographic projection of the black matrix of the array substrate onto the base substrate; and/or the orthographic projection of the second repairing pattern onto the base substrate is located within the orthographic projection of the black matrix of the array substrate onto the base substrate.

16. The method according to claim 11, wherein the target signal line is a common electrode line parallel with the data lines.

17. An array substrate, comprising a plurality of pixel units defined by gate lines and data lines that are crossed, wherein each of the plurality of pixel units comprises a pixel electrode and a thin film transistor, and the array substrate further comprises:
a base substrate; and
repairing units corresponding to target pixel electrodes in the pixel electrodes, wherein each of the repairing units is connected to a corresponding target pixel electrode and a corresponding target signal line, and each of the repairing units is configured to control the target pixel electrode and the target signal line that are connected to the repairing unit to be electrically connected to each other or electrically insulated from each other,
wherein the repairing units and the pixel electrodes are arranged on the base substrate, and each of the repairing units comprises a first repairing pattern and a second repairing pattern that are stacked and an insulation layer arranged between the first repairing pattern and the second repairing pattern; and
the first repairing pattern is connected to the corresponding target pixel electrode, the second repairing pattern is connected to the corresponding target signal line, and an orthographic projection of the first repairing pattern onto the base substrate at least partially overlaps with an orthographic projection of the second repairing pattern onto the base substrate to form a first overlapped region, wherein the first repairing pattern or the second repairing pattern, and the insulation layer are meltable at the first overlapped region; or the insulation layer is breakable at the first overlapped region, whereby the first repairing pattern and the second repairing pattern are fused together at the first overlapped region.

18. The array substrate according to claim 17, wherein in a case that the target pixel electrode is configured to be electrically connected to a corresponding thin film transistor, the repairing unit connected to the target pixel electrode is non-conductive, and the target pixel electrode and the corresponding target signal line are electrically insulated from each other by the non-conductive repairing unit; and in a case that the target pixel electrode is configured to be disconnected from the corresponding thin film transistor, the repairing unit connected to the target pixel electrode is conductive, and the target pixel electrode and the corresponding target signal line are electrically connected to each other by the conductive repairing unit.

19. The array substrate according to claim 17, wherein each first repairing pattern and a gate layer of the corresponding thin film transistor are formed from a same metal material in one patterning process, and each second repairing pattern and a source-drain layer of the corresponding thin film transistor are formed from a same metal material in one patterning process.

* * * * *